US006197655B1

(12) United States Patent
Montanini et al.

(10) Patent No.: US 6,197,655 B1
(45) Date of Patent: Mar. 6, 2001

(54) METHOD FOR MANUFACTURING INTEGRATED STRUCTURES INCLUDING REMOVING A SACRIFICIAL REGION

(75) Inventors: Pietro Montanini, Melegnano; Marco Ferrera, Domodossola; Laura Castoldi, Abbiategrasso; Ilaria Gelmi, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/113,466

(22) Filed: Jul. 10, 1998

(30) Foreign Application Priority Data

| Jul. 10, 1997 | (EP) | 97830345 |
| Jul. 31, 1997 | (EP) | 97830406 |
| Jul. 31, 1997 | (EP) | 97830407 |
| Oct. 23, 1997 | (EP) | 97830537 |
| Apr. 30, 1998 | (EP) | 98830266 |

(51) Int. Cl.[7] .............................................. H01L 21/76
(52) U.S. Cl. ............................................ 438/411; 438/723
(58) Field of Search .................................. 438/411, 723

(56) References Cited

U.S. PATENT DOCUMENTS

| 4,351,894 | * | 9/1982 | Yonezawa et al. | 430/313 |
| 5,438,015 | * | 8/1995 | Lur | 438/411 |
| 5,470,797 | | 11/1995 | Mastrangelo | 437/225 |
| 5,516,710 | | 5/1996 | Boyd et al. | 437/31 |

FOREIGN PATENT DOCUMENTS 0 822 579 A1   2/1998  (EP).

OTHER PUBLICATIONS

Goosen, J.F.L., et al., "Problems of Sacrificial Etching in a Combined Surface Micromachining and Electronic Process," *Proceedings of the 1996 National Sensor Conference*, Delft, The Netherlands, Mar. 20–12, 1996, Mar. 20, 1996, pp. 193–196, XP 000697536.

Eriksen, Gert F. and Karsten Dyrbye, "Protective Coatings in Harsh Environments," J. Micromech. Microeng. ©1996, 55–57, IOP Publishing LTD, U.K.

* cited by examiner

*Primary Examiner*—Charles Bowers
*Assistant Examiner*—David S Blum
(74) *Attorney, Agent, or Firm*—Theodore E. Galanthay; Robert Iannucci; Seed Intellectual Property Law Group PLLC

(57) ABSTRACT

The method is based on the use of a silicon carbide mask for removing a sacrificial region. In case of manufacture of integrated semiconductor material structures, the following steps are performed: forming a sacrificial region of silicon oxide on a substrate of semiconductor material; growing a pseudo-epitaxial layer; forming electronic circuit components; depositing a silicon carbide layer; defining photolithographically the silicon carbon layer so as to form an etching mask containing the topography of a microstructure to be formed; with the etching mask, forming trenches in the pseudo-epitaxial layer as far as the sacrificial region so as to laterally define the microstructure; and removing the sacrificial region through the trenches.

16 Claims, 3 Drawing Sheets

METHOD FOR MANUFACTURING INTEGRATED STRUCTURES INCLUDING REMOVING A SACRIFICIAL REGION

TECHNICAL FIELD

The present invention relates to a method for manufacturing integrated structures including removing a sacrificial region. In particular, the method refers to the manufacture of integrated microstructures such as microsensors, microactuators and special micromechanisms.

BACKGROUND OF THE INVENTION

Recently, methods for manufacturing microstructures have been proposed, which are based on process and technology steps typical of the manufacture of integrated circuits and enabling a microintegrated structure and associated control electronics to be integrated in a single chip.

For example, EP-A-0 822 579 describes a method according to which an embedded sacrificial region of silicon oxide is formed above a substrate of monocrystalline silicon; a pseudo-epitaxial layer is then grown, which has, above the embedded sacrificial layer, a polycrystalline structure and elsewhere a monocrystalline structure; the electronic components of the circuitry are integrated in the monocrystalline structure portion of the pseudo-epitaxial layer; trenches are formed in the polycrystalline structure portion of the pseudo-epitaxial layer so as to define the form of the desired microintegrated structure and, through the trenches themselves, the embedded sacrificial region is etched so as to form a suspended mass which can be used as a static, kinematic or dynamic microstructure.

The operations of trenching and removing the embedded sacrificial region require two etching processes: a first etching through a thick silicon layer (the pseudo-epitaxial layer has typically a thickness of 8–9 $\mu$m) and a second etching using concentrated hydrofluoric acid. These operations are therefore somewhat complex, in particular the second wet etching process with a very aggressive solution gives rise to problems as regards already exposed pad metal regions. In fact tests carried out using a single masking resist layer for defining the microstructure and protecting the pad metal regions have produced negative results, since the machine used for forming the trenches (MXT machine made by AMT) is not sufficiently selective with respect to the resist layer.

Also, in the case of using a double resist mask, a first one defined on the active area nitride with the design of the desired microstructures and a second one covering the entire device, including the pads, except for large windows above the microstructures to be formed, has provided unsatisfactory results.

The same problem arises when it is required to remove a sacrificial layer or a region by an etching process which is aggressive and/or has long duration. In fact, present resist masks are unable to sufficiently withstand etching operations which have a duration of more than a few minutes and/or a high concentration (for example hydrofluoric acid with a concentration of up to 49%).

SUMMARY OF THE INVENTION

An object of the invention is therefore to provide a method so as to allow complete removal of sacrificial regions even when long durations and/or high concentrations of very aggressive solutions are required.

According to the present invention, there is provided a method for manufacturing integrated structures. In one embodiment of the invention, the method comprises forming a wafer including a semiconductor material substrate and a sacrificial region; forming an etching mask, which comprises silicon carbide, above the wafer; and removing the sacrificial regions using said etching mask.

Hereinafter, a method for manufacturing an integrated structure including a suspended mass formed in a region of polycrystalline silicon grown epitaxially will be described by way of a non-limiting example. However, as discussed below, the invention is not limited to the described example and extends in general to the use of a silicon carbide mask for protecting regions of semiconductor material, metal and other materials used in the microelectronics industry during etching for the removal of sacrificial regions.

DETAILED DESCRIPTION OF THE INVENTION

The method described here comprises initial steps which are similar to those of the known method summarized above and described rapidly here with reference to FIGS. 1–5 in which different layers and regions are not shown to scale.

Figure 1:
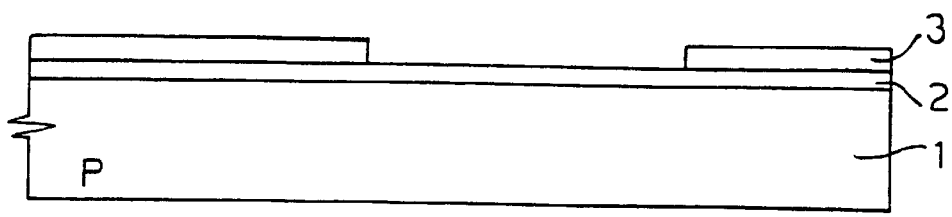
FIGS. 1–5 show cross-sections through a wafer of semiconductor material during different steps of the known method.
Figure 2:
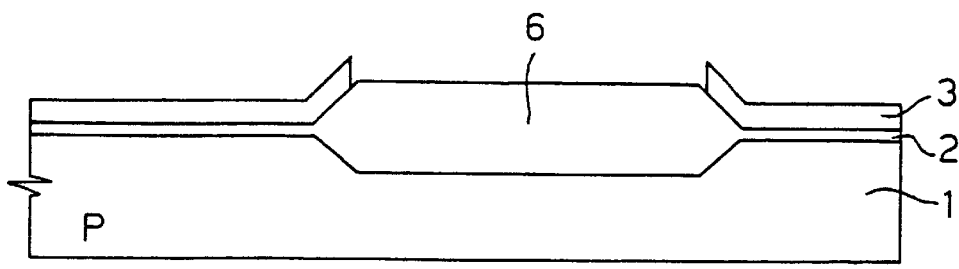
Figure 3:
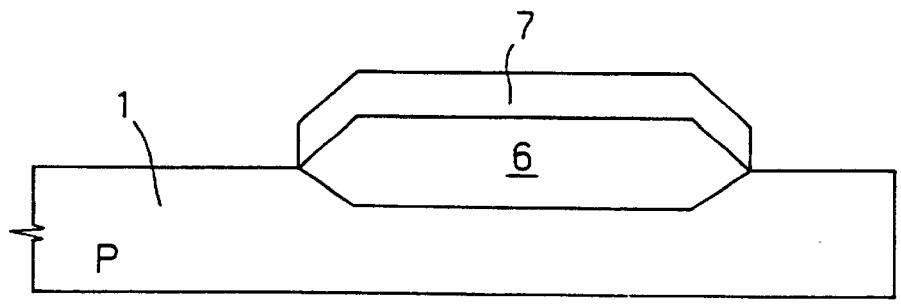

Initially, a silicon oxide layer 2 is formed above a substrate 1 of monocrystalline silicon; a silicon nitride layer 3 is deposited above the silicon oxide layer 2 and a phototechnical step and a step of etching nitride in the zone where the desired microstructure is to be formed are carried out. The intermediate structure according to FIG. 1 is thus obtained. Subsequently, a step of local oxidation, masked by silicon nitride layer 3 is performed, which results in forming a sacrificial region 6 of silicon oxide having a thickness, for example, of 2 $\mu$m (FIG. 2).

Then the silicon nitride layer 3 is removed and a polycrystalline silicon layer with a thickness, for example, of 4500 Å is deposited; by a phototechnical and chemical etching step, the polysilicon layer, except for the zone above the sacrificial region 6, and the silicon oxide layer 2 above substrate 1, are removed. The remaining portion of the polycrystalline silicon layer, denoted at 7 in FIG. 3, therefore forms the seed for a next epitaxial growth step. If envisaged by the process, steps of implanting doping species for forming embedded structures and/or junction isolating regions using top/bottom technique are performed in a manner known per se and not shown.

Figure 4:
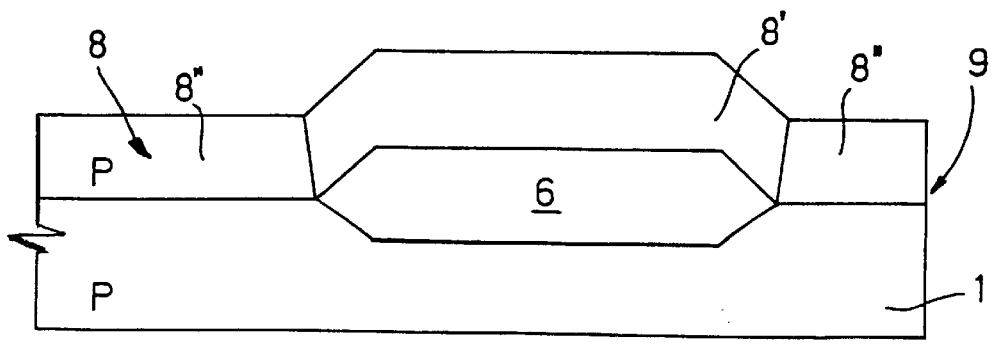

Then an epitaxial growth is performed, forming a pseudo-epitaxial layer 8 having a thickness of 8 $\mu$m for example, including a polycrystalline region 8' above the sacrificial region 6 and a monocrystalline region 8" elsewhere. A wafer indicated at 9 in FIG. 4 is thus obtained. Then, standard process steps for forming electronic components, including forming conducting and isolating regions inside monocrystalline region 8" as well as conductive, connecting and isolating regions above wafer 9, are performed. For example, in accordance with FIG. 5, pockets 10, 11 forming part of a MOS transistor 12 and a bipolar transistor 13 shown schematically are formed in monocrystalline region 8".

Figure 5:
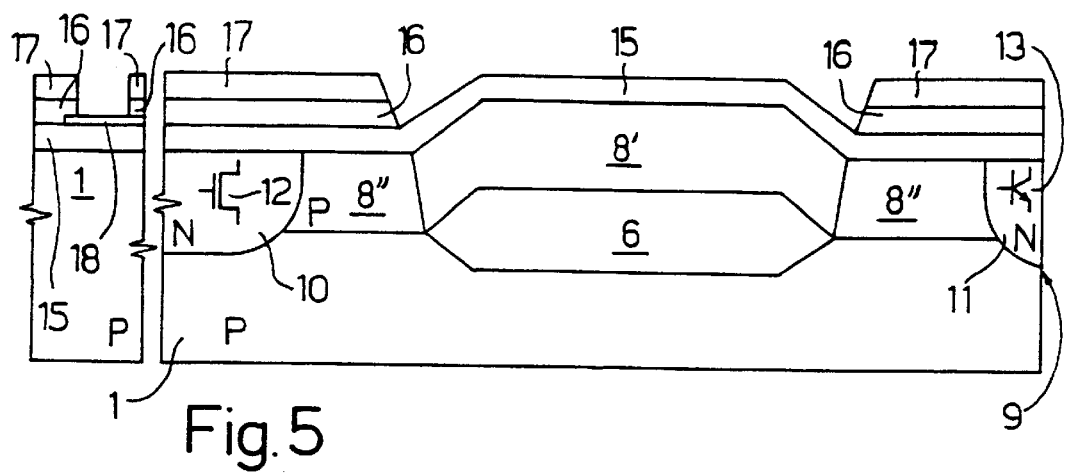
Figure 6:
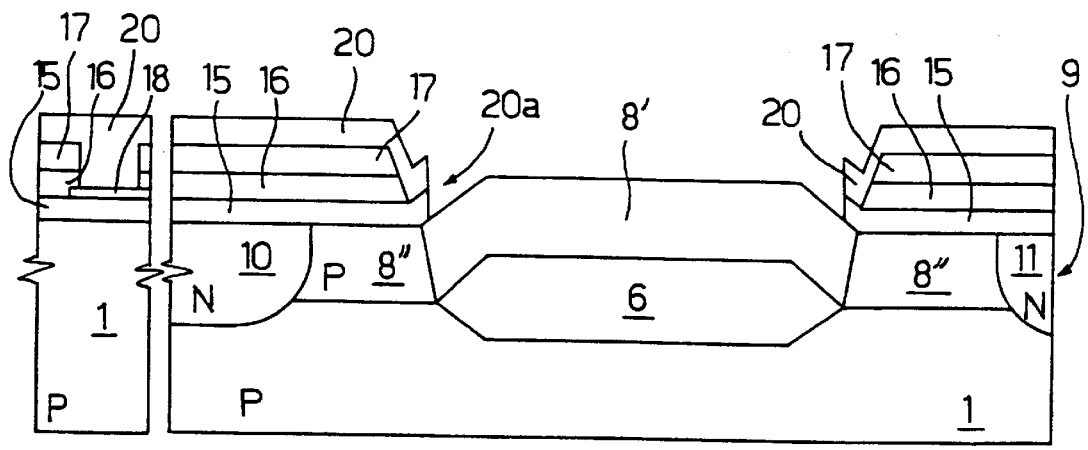
FIGS. 6–10 show cross-sections similar to those of FIGS. 1–5, during different steps of the method according to the invention.

A first dielectric layer 15 (for example BPSG—Boron Phosphorous Silicon Glass) is deposited; metal areas are formed and contact pads are defined, one whereof being visible in FIG. 5, at 18; a second dielectric layer 16 (for example PSG—Phosphorous Silicon Glass) and then a passivating layer 17 (for example, oxynitride) are deposited; then, by a special phototechnical and chemical etching step, portions of second dielectric layer 16 and of passivating layer 17 are removed from region of pad 18 (as can be seen on the left in FIG. 5) as well as in the zone above a microstructure to be formed (above polycrystalline region 8'). First dielectric layer 15 is deliberately left above polycrystalline region 8' in order to protect a zone where the microstructure must be formed, obtaining the structure according to FIG. 5 which is then subjected to electrical tests envisaged for wafers.

After the initial steps described above have been performed, following process steps, as shown in FIGS. 6–10, according to the present invention are carried out. A barrier layer 20, for example oxide obtained from TEOS (tetraethylothorsilicate) with a thickness of 1000 Å, is deposited; by a phototechnical and chemical etching step, barrier layer 20 is then removed so as to form a window 20a in a zone where the microstructure will be formed; simultaneously also the exposed portions of first dielectric layer 15 are removed, providing the intermediate structure according to FIG. 6.

Figure 7:
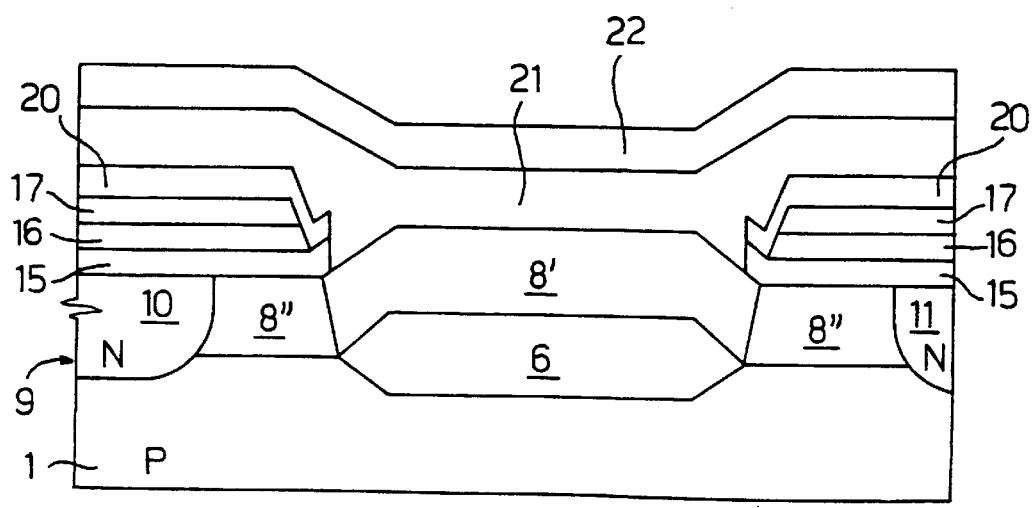
Figure 8:
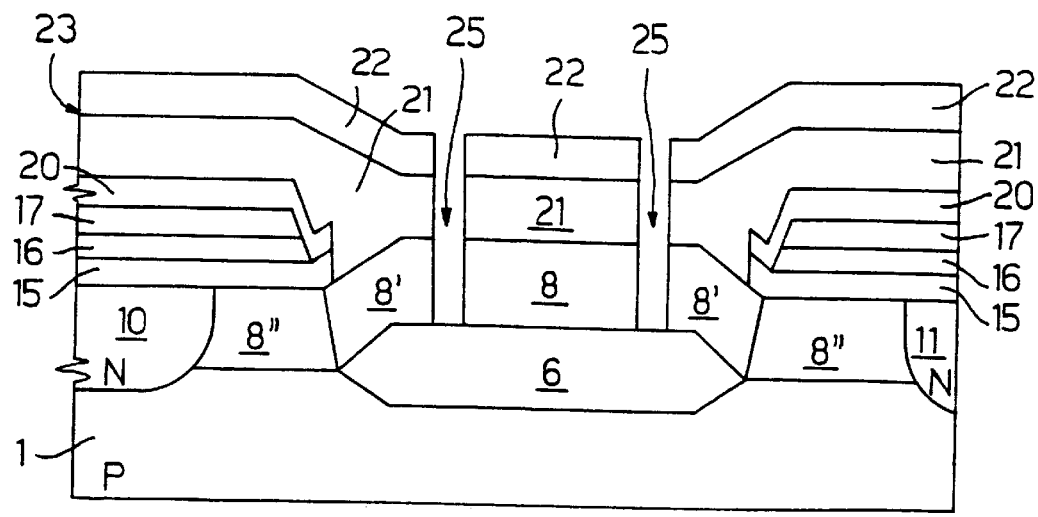

Then, initially a first masking layer 21, comprising silicon carbide, with a thickness for example of 7500 Å, followed by a second masking layer 22, preferably comprising oxide obtained from TEOS, with a thickness for example of 4000 Å, are deposited, as shown in FIG. 7. A phototechnical step for defining the microstructure is then performed using a resist mask; thus, parts of the first and second masking layers 21 and 22 corresponding to a desired lithographic form for the microstructure are then removed. Masking layers 22 and 21 therefore form a hard mask 23. Then, using hard mask 23 just obtained, the silicon of polycrystalline region 8' is chemically etched in order to form trenches laterally defining the desired microstructure. The chemical etching step is interrupted automatically on silicon oxide sacrificial region 6. At the end of the etching step, the structure according to FIG. 8, in which the trenches in the polycrystalline region 8' are indicated by 25, is thus obtained.

Figure 9:
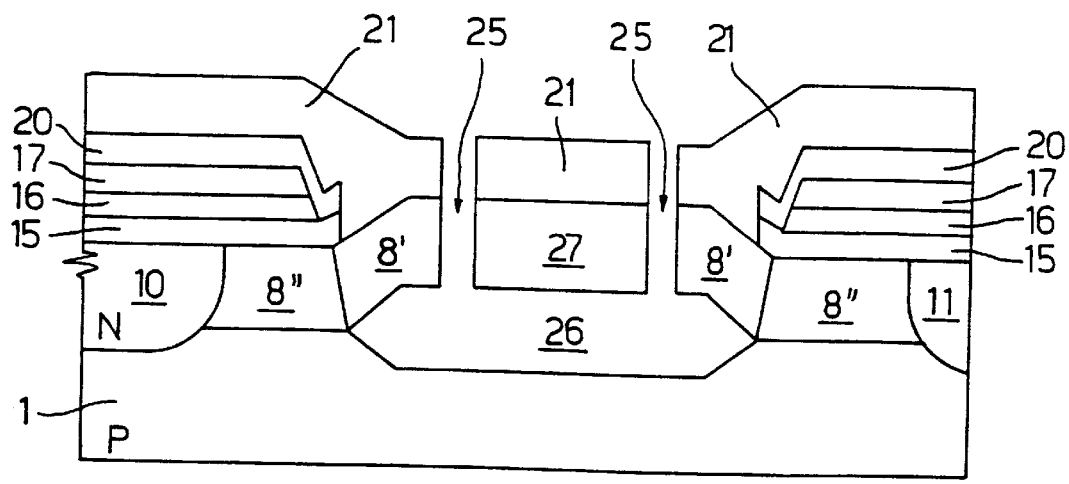
Figure 10:
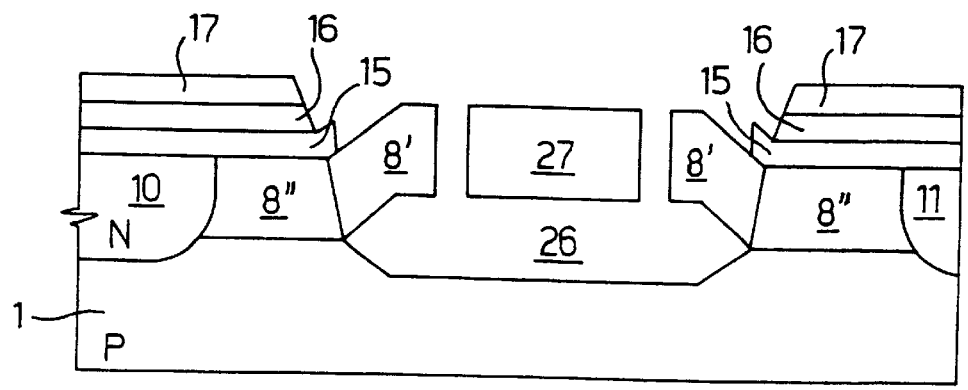

Afterwards, silicon oxide forming sacrificial region 6 is removed by etching with concentrated hydrofluoric acid; during this step, the oxide forming second masking layer 22 is also removed. The structure according to FIG. 9 is thus obtained, wherein, instead of sacrificial region 6, there is now an air gap 26 defining at the bottom the suspended mass (indicated by 27) of the microstructure.

Second masking layer 21 is then removed by exposing to a sulfur hexafluoride solution ($SF_6$) which removes silicon carbide from the surface of polycrystalline region 8' and barrier layer 20; during this step, barrier layer 20 protects silicon nitride passivating layer 17 which would be etched by the silicon carbide etching mixture. Finally, barrier layer 20 is removed, providing the final structure according to FIG. 10.

In the described method, barrier layer 20, as shown, has the function of providing an end point of silicon carbide removal etching, but must also be removed beforehand from the zone where the microstructure is to be formed, so as to avoid infiltration of hydrofluoric acid at the interface between polycrystalline region 8' and first silicon carbide masking layer 21 during removal of sacrificial region 6; consequently, the mask used for removing barrier layer 20 (and first dielectric layer 15, FIG. 6) must define a window 20a with such dimensions as to expose the microstructure zone, but covering passivating layer 17 on all sides.

Second masking layer 22 has the function of allowing correct formation of trenches 25, even when the etched area (not covered by hard mask 23) represents a significant portion of the total area of the wafer (more than about 5%) or there are zones with a high concentration of exposed area; in fact, under these conditions, in the absence of second masking layer 22, there could be problems of etched material redeposition. Second masking layer 22 therefore ensures good trench etching, without complicating the process steps or creating problems of removal, since, as explained above, it is removed completely by hydrofluoric acid during etching of sacrificial region 6. However, if the above-mentioned area conditions do not occur or if etching technique ensures trench correct etching irrespective of the existing topography, it is possible to dispense with second masking layer 22 and perform both etching of the trenches and etching for removing the sacrificial region using silicon carbide layer alone.

The use of silicon carbide for protecting the wafer functionally important exposed regions (pad metal regions) during the steps of forming the trenches and removing the sacrificial region allows aggressive chemical etching solutions, such as hydrofluoric acid, to be used. It also ensures excellent etching profiles and avoids damage to important parts of the integrated devices, despite the need to remove the material (silicon oxide) to a depth and in quantities which are unusual for the electronics industry.

In particular, the silicon carbide mask is able to ensure excellent protection of the underlying layers and regions also in the case of etching using hydrofluoric acid for a duration of up to 1 hour at a concentration of up to 49%.

Basically, it has been shown that use of silicon carbide allows requirements of micromachining, to be combined with those of microelectronics, achieving excellent results.

In the method described above, the thickness of silicon carbide layer 21 depends essentially on evenness of the wafer prior to deposition of the silicon carbide layer itself. In particular, the above-mentioned thickness (7500 Å) reliably prevents infiltration of hydrofluoric acid in weak points of the silicon carbide layer itself when discontinuities are present, and may therefore be reduced significantly in case of wafers with an even surface.

Finally it is obvious that numerous modifications and variations may be made to the method described and illustrated herein, all of which falling within the scope of the invention, as defined in the accompanying claims. In particular, the use of silicon carbide as a mask for etching a sacrificial region with a very aggressive acid is also applicable to processes other than that described above; for example, the invention is applicable to processes using SOI substrates, in which the silicon oxide layer comprised between the two wafers of monocrystalline silicon forms (partly) the sacrificial region (see, for example, EP-A-0 822 398) or the sacrificial region is made using different techniques, for example is formed by deposited oxide or by oxide regions formed in special recesses of the substrate. The present method is also applicable to suspended structures formed by polycrystalline silicon deposited above sacrificial oxide regions in turn formed above the substrate, at the end of the process for forming circuitry electronic components; or else when the sacrificial region is obtained by oxidating porous silicon. The silicon carbide mask can be used also for removing embedded regions of material different from silicon oxide and in case of an etching agent other than hydrofluoric acid, for example in case of suspended structures of metal material, in which the sacrificial region comprises polymer material which is removed by an alkaline agent, such as oxygen plasma.

What is claimed is:

1. A method for manufacturing integrated structures, comprising the steps of:

forming a wafer including at least a semiconductor material substrate and a sacrificial region;

forming a semiconductor layer on the sacrificial region;

forming a barrier layer on the semiconductor layer and over portions of the wafer lateral of the sacrificial region;

forming an opening in the barrier layer over the semiconductor layer to expose an area of the semiconductor layer directly above the sacrificial region and leave barrier portions of the barrier layer laterally of the opening;

forming an etching mask on the semiconductor layer through the opening and on the barrier regions;

forming a hole through the etching mask and semiconductor layer; and removing said sacrificial region through the hole while using said etching mask to protect the semiconductor layer, wherein said etching mask comprises silicon carbide.

2. The method according to claim 1 wherein said sacrificial region comprises silicon oxide.

3. The method according to claim 1 wherein said step of removing said sacrificial region is performed by chemical etching with hydrofluoric acid.

4. The method according to claim 1 wherein:

said etching mask is contains a topography of a microstructure to be formed in the semiconductor layer;

using said etching mask, trenches are formed in said semiconductor layer so as to laterally define said microstructure, said trenches extending as far as said sacrificial region and including the hold; and said sacrificial region is removed through said trenches.

5. The method according to claim 1 wherein said step of forming the etching mask comprises a step of forming a silicon carbide layer and defining photolithographically said silicon carbide layer.

6. The method according to claim 1 wherein said barrier layer comprises silicon oxide deposited from TEOS.

7. The method according to claim 5 wherein, after said step of forming a silicon carbide layer and prior to said step of defining photolithographically, a step of forming a masking layer on the silicon carbide layer is performed and said step of photolithographically defining also comprises a step of selectively removing a portion of said masking layer so that the hole extends through the semiconductor layer, silicon carbide layer, and masking layer, wherein the masking layer is removed simultaneously with the sacrificial region.

8. The method according to claim 7 wherein said masking layer comprises silicon oxide.

9. The method according to claim 8 wherein said silicon oxide is deposited from TEOS.

10. The method according to claim 4 wherein said step of forming a wafer comprises forming an oxide region on said substrate, said oxide region being the sacrificial region; and the step of forming the semiconductor layer includes:
    growing epitaxially said semiconductor layer.

11. The method according to claim 1 wherein, prior to said step of forming an etching mask, the following steps are performed:

creating integrated electronic components in said semiconductor layer;

forming a contact pad of electrically conducting material above said wafer;

forming a passivating layer above said wafer; and creating an opening in said passivating layer above said contact pad.

12. The method of claim 11 wherein the step of forming the barrier layer includes forming the barrier layer in the opening above the contact pad such that the barrier layer contacts the contact pad.

13. A method for manufacturing an integrated microstructure device having a semiconductor material substrate, comprising following steps:

forming a sacrificial region on the semiconductor material substrate;

forming a semiconductor material layer, the sacrificial region being positioned between the substrate and the semiconductor material layer;

forming an etching mask over the sacrificial region and the semiconductor material layer, said etching mask comprising silicon carbide; and removing the sacrificial region, wherein the step of forming the etching mask comprises:

forming a first masking layer, the first masking layer including silicon carbide;

forming a second masking layer over the first masking layer;

photolithographically defining the first and second masking layers; and removing parts of the first and second masking layer being photolithographically defined.

14. The method of claim 13, further comprising:

forming trenches in the semiconductor material layer to laterally define the microstructure, the trenches extending as far as the sacrificial region; and removing the sacrificial region through the trenches to form a suspended region of the semiconductor material layer.

15. The method of claim 13 wherein, prior to the step of forming the first masking layer, the method further comprises:

forming a barrier layer over the semiconductor material layer; and selectively removing the barrier layer to form a barrier region and an opening region for hosing the microstructure of the device.

16. The method of claim 15 wherein the step of forming the barrier layer comprises:

forming a first dielectric layer of BPSG or PSG;

forming a passivating layer of oxynitride over the first dielectric layer; and forming a second dielectric layer of TEOS.

* * * * *